United States Patent [19]

Trobough

[11] Patent Number: 5,097,101
[45] Date of Patent: Mar. 17, 1992

[54] METHOD OF FORMING A CONDUCTIVE CONTACT BUMP ON A FLEXIBLE SUBSTRATE AND A FLEXIBLE SUBSTRATE

[75] Inventor: Douglas W. Trobough, Beaverton, Oreg.

[73] Assignee: Tektronix, Inc., Beaverton, Oreg.

[21] Appl. No.: 650,549

[22] Filed: Feb. 5, 1991

[51] Int. Cl.⁵ .............................................. H05K 1/00
[52] U.S. Cl. .................................. 174/254; 174/261; 29/846; 29/852
[58] Field of Search ................... 29/846, 852; 361/398, 361/403, 406, 414; 174/254, 261; 439/67

[56] References Cited

U.S. PATENT DOCUMENTS

| | | | |
|---|---|---|---|
| 2,912,745 | 11/1959 | Steigerwalt et al. | 361/406 |
| 4,116,517 | 9/1978 | Selvin et al. | 439/67 |
| 4,173,712 | 11/1979 | Purser | 174/35 R |
| 4,396,457 | 8/1983 | Bakermans | 437/183 |
| 4,403,272 | 8/1983 | Larson et al. | 361/398 |
| 4,736,277 | 4/1988 | Brown | 29/846 |
| 4,784,972 | 11/1988 | Hatada | 437/183 |
| 4,835,859 | 6/1989 | Beckett | 29/846 |

FOREIGN PATENT DOCUMENTS 2222727  3/1990  United Kingdom ................... 29/846

*Primary Examiner*—P. W. Echols
*Attorney, Agent, or Firm*—John D. Winkelman; John Smith-Hill

[57] ABSTRACT

A flexible circuit board is formed from a sheet of polyimide having a contact pad on its first side and a continuous layer of copper on its second side by removing copper from the second side so as to leave at least one discrete island that confronts the pad through the sheet of insulating material, and applying force to the island in the direction from the second side toward the first side, whereby the island is deformed plastically to form a dimple and the pad is deformed plastically to form a bump.

12 Claims, 2 Drawing Sheets

METHOD OF FORMING A CONDUCTIVE CONTACT BUMP ON A FLEXIBLE SUBSTRATE AND A FLEXIBLE SUBSTRATE

Background of the Invention

This invention relates to a method of forming a conductive contact bump on a flexible insulating substrate.

Generally, a test and measurement instrument or other item of electronic apparatus is composed of multiple distinct modules. Each module has an interface region, in which there are contact pads that are connected to other modules of the instrument or to an external device, such as a device under test.

It is known to use a flexible circuit board for interconnecting two modules of a test and measurement instrument. Such a flexible circuit board comprises a substrate of flexible insulating material, such as polyimide, and metal conductor runs adhering to the substrate. Generally, each run terminates at the two opposite ends of the flexible circuit board in respective contact pads. The two ends of the flexible circuit board are placed with their front surfaces (the surfaces provided with contact pads) in contact with the interface regions of the two modules respectively, and respective bodies of elastomer material are compressed against the back surface of the circuit board at its two opposite ends so that the contact pads of the circuit board are held in electrically conductive pressure contact with corresponding pads of the modules. Since the substrate material of the circuit board is flexible, the circuit board can conform to an interface region that is not planar.

Contact bumps may be provided on the contact pads of the flexible circuit board in order that the contact pressure between the pads of the flexible circuit board and the corresponding pads of the electronic modules should be sufficient to achieve reliable electrically conductive connection between the conductor runs of the flexible circuit board and the pads of the modules.

It is known to provide contact bumps on a flexible circuit board by deforming the contact pads. The flexible circuit board is placed with its back surface (the surface without contact pads) against a female die formed with multiple recesses, and a male die having pins that register with the recesses is pressed against the back surface of the circuit board so that the contact pads are deformed into the recesses respectively. The metal of the contact pads is strained beyond its yield point, and therefore contact bumps that project from the front surface of the flexible circuit board are formed. This method of forming a contact bump is subject to the disadvantage that the bump is not very strong, and therefore when the circuit board is first used there is a possibility that the bump will be at least partially crushed, impairing the quality of the pressure contact between the pad of the flexible circuit board and the corresponding pad of the electronic module.

The problem of crushing of hollow contact bumps has previously been addressed in two ways. One technique for strengthening a contact bump has been to fill the corresponding dimple on the back surface of the circuit board with a curable liquid support material, such as polymer thick film material, and then cure the support material. This technique solves the problem of crushing of contact bumps, but introduces a new problem, in that it is difficult to fill the dimples, particularly small dimples, without trapping air bubbles in the liquid support material. Since a trapped bubble can allow the contact bump to be crushed, use of a filling of curable liquid support material to strengthen a hollow contact bump is only applicable to a contact bump that is fairly low in height and/or of large area, so that bubbles are not readily trapped.

A second known technique for improving the strength of a hollow contact bump involves providing a second layer of copper or other metal on the back surface of the substrate. The second layer of copper is continuous and is strained beyond the yield point when the contact bump is formed, and thus supports the contact bump against crushing. However, this technique is subject to disadvantage, in that the circuit board is much stiffer than a circuit board with metal on only one side, and therefore it is not as well able to conform to non-planar interface regions of the modules to be connected.

SUMMARY OF THE INVENTION

In accordance with a first aspect of the invention, a sheet of flexible insulating material having first and second opposite sides and first and second layers of metal on the first and second sides respectively is processed by removing metal of the first and second layers so as to define at least one contact pad on the first side and at least one discrete island on the second side, the island confronting the contact pad through the sheet of insulating material, and applying force to the island in the direction from the second side toward the first side, whereby the island is deformed plastically to form a dimple and the contact pad is deformed plastically to form a contact bump.

In accordance with a second aspect of the invention, a method of forming a flexible circuit board comprises providing a sheet of flexible insulating material having first and second opposite sides, depositing first and second layers of metal on the first and second opposite sides respectively of the sheet of insulating material, removing metal of the first and second layers so as to define at least one contact pad on the first side of the sheet of insulating material and at least one discrete island on the second side, the island confronting the pad through the sheet of insulating material, and applying force to the island in the direction from the second side toward the first side, whereby the island is deformed plastically to form a dimple and the pad is deformed plastically to form a bump.

In accordance with a third aspect of the invention, a method of processing a sheet of insulating material having first and second opposite sides, at least one contact pad on the first side, and a continuous layer of metal on the second side, comprises the steps of removing metal from the second side so as to leave at least one discrete island that confronts the pad through the sheet of insulating material, and applying force to the island in the direction from the second side toward the first side, whereby the island is deformed plastically to form a dimple and the pad is deformed plastically to form a bump.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
FIG. 1 is a partial sectional view of a composite structure used in fabrication of a flexible circuit at a first stage in fabrication.
Figure 2A:
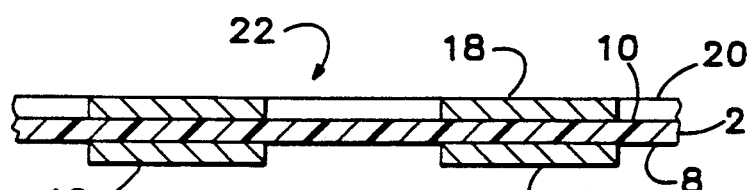
FIG. 2A is a partial sectional view of the composite structure at a second stage in fabrication.
Figure 2B:
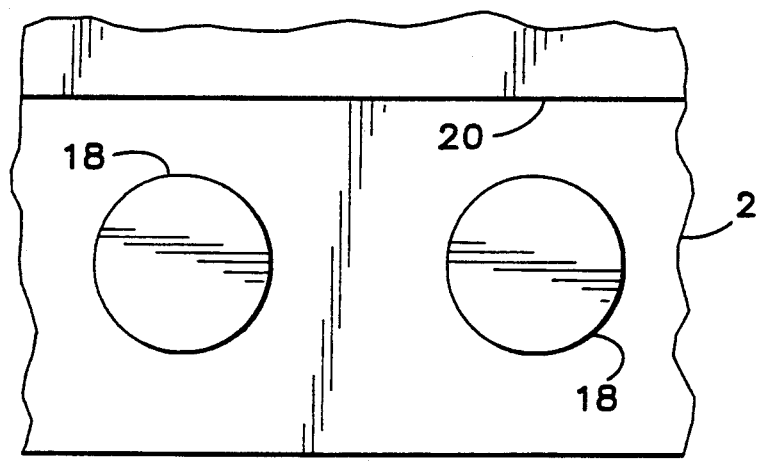
FIG. 2B is a plain view of the structure shown in FIG. 2A.
Figure 2C:
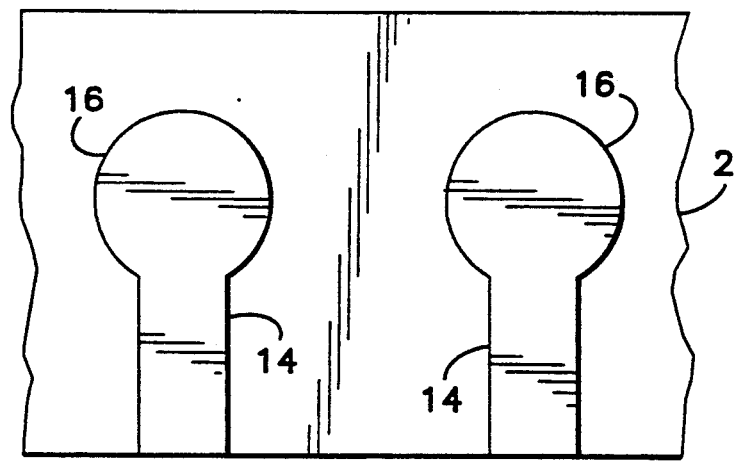
FIG. 2C is a bottom view of the structure shown in FIG. 2A.

FIG. 1 illustrates a three-layer composite structure comprising a substrate 2 of insulating material having layers 4 and 6 of copper adhered to its front and back surfaces 8, 10 respectively. The substrate may, for example, be a single sheet of polyimide or it may be a composite sheet comprising two or more layers of polyimide bonded together by adhesive material. The insulating substrate is at least about 0.05 mm thick and the layers of copper are about 0.04 mm thick. As shown in FIGS. 2A and 2C, layer 4 is selectively etched to define discrete conductor runs 14 and contact pads 16. Layer 6 is selectively etched to define discrete islands 18 and a ground plane 20. Islands 18 lie directly behind contact pads 14, so that each contact pad is confronted through the substrate by an island 18. The resulting structure is designated 22.

Figure 3:
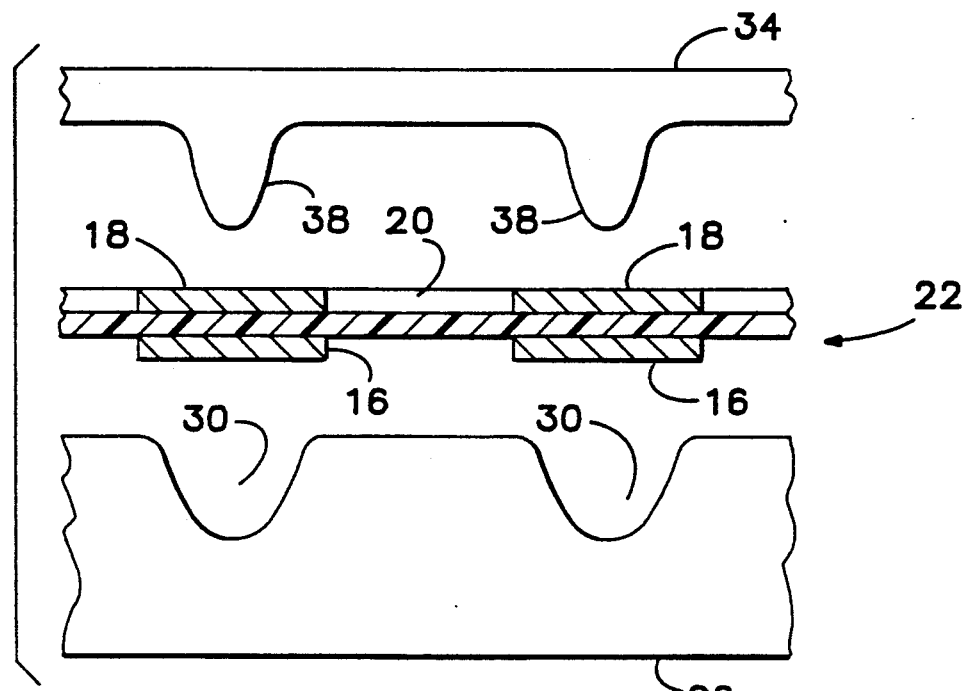
FIG. 3 is a sectional view of the structure shown in FIGS. 2A-2C when received in a forming tool.
Figure 4:
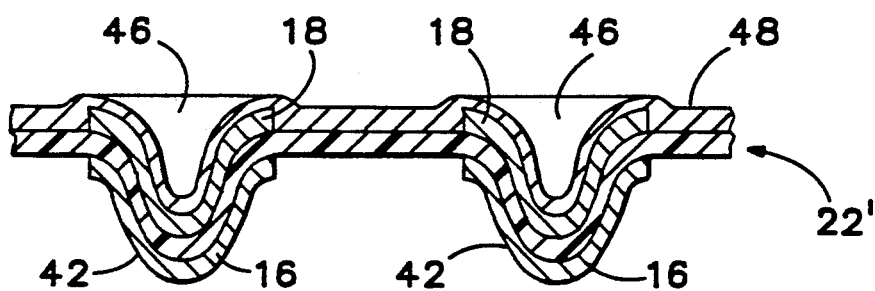
FIG. 4 is a partial sectional view of the composite structure after forming in the tool shown in FIG. 3.

Referring to FIG. 3, the structure 22 is placed in a forming tool comprising a female die 26 formed with recesses 30 shaped to correspond to the configuration of the desired contact bumps, and a male die 34 having pins 38 positioned to enter the recesses respectively. The composite structure 22 is positioned with each contact pad 16 over one of the recesses 30, and the male die is then forced down, toward the female die. The pins deform the composite structure, so that the contact pads 16 form convex bumps 42 (FIG. 4) at the front surface of the substrate and the islands 18 define concave dimples 46 at the back surface of the substrate. A layer 48 of conductive material, such as silver paste, is applied to the back surface of the deformed structure 22' in order to provide a continuous ground plane. Such a layer is very flexible and does not interfere significantly with the ability of structure 22' to conform to a non-planar interface region of a module of electronic apparatus.

After the bumps have been formed, they are coated with an environmentally stable metal, such as gold (not shown), in order to ensure that a reliable electrically conductive pressure contact can be achieved between the bumps and the contact pads of a module of electronic apparatus.

The bumps of the flexible circuit board manufactured in accordance with the method described with reference to FIGS. 1-4 are not readily crushed, but the flexible circuit board is nevertheless sufficiently flexible to accommodate a fairly wide tolerance on the topography of the interface regions of the modules to which it is connected. Accordingly, the flexible circuit board shown in FIG. 4 has the advantage afforded by use of a layer of metal on the back surface of the substrate, without the disadvantage that arises from that layer being continuous.

By use of the method described with reference to FIGS. 1-4, bumps having a height of from about 0.1 mm to about 0.3 mm, preferably about 0.2 mm, can be formed. The minimum spacing between the bumps depends on the thicknesses of the various layers of the flexible circuit board. In the case of the described embodiment of the invention, bumps have been formed with a spacing of about 1.8 mm.

It will be appreciated that the invention is not restricted to the particular embodiment that has been described, and that variations may be made therein without departing from the scope of the invention as defined in the appended claims and equivalents thereof. For example, the invention is not limited to use of copper as the metal of the contact pads and islands, since other formable metals, such as alloys of copper and alloys of iron, also could be used. The invention is not restricted to the bumps being of any particular shape, since the shape of the bumps depends on the shape of the female die and the shape of the forming pin. Although the islands 18 are shown as being of the same general shape as the contact pads 16, this is not essential, nor is it essential that the islands be the same size as the pads. Although it is preferred that a layer of flexible conductive material be applied to the back surface of the flexible circuit board after the bumps have been formed, this is not essential. It is also not essential to the invention that the forming tool have two rigid dies, since bumps may be formed by use of a male or female die in conjunction with a conformal forming member.

I claim:

1. A method of processing a sheet of flexible insulating material having first and second opposite sides and first and second layers of metal on the first and second sides respectively, said method comprising:
   (a) removing metal of the first and second layers so as to leave at least one contact pad on the first side and at least one discrete island on the second side, the island confronting the contact pad through the sheet of insulating material, and
   (b) applying force to the island in the direction from the second side toward the first side, whereby the island is deformed plastically to form a dimple and the contact pad is deformed plastically to form a contact bump.

2. A method in accordance with claim 1, wherein the flexible insulating material is polyimide, the metal of the first layer contains copper and the metal of the second layer contains copper.

3. A method in accordance with claim 1, further comprising:
   (c) applying a layer of flexible conductive material to the second side of the sheet of flexible material.

4. A flexible circuit board manufactured by a method in accordance with claim 1.

5. A method of forming a flexible circuit board from a sheet of insulating material having first and second opposite sides, said method comprising:
   (a) depositing first and second layers of metal on the first and second sides respectively of the sheet of insulating material,
   (b) removing metal of the first and second layers so as to define at least one discrete contact pad on the first side of the sheet of insulating material and at least one discrete island on the second side, the island confronting the pad through the sheet of insulating material, and
   (c) applying force to the island in the direction from the second side toward the first side, whereby the island is deformed plastically to form a dimple and the pad is deformed plastically to form a bump.

6. A method in accordance with claim 5, wherein the flexible insulating material is polyimide, the metal of the first layer contains copper and the metal of the second layer contains copper.

7. A method in accordance with claim 5, further comprising:
 (d) applying a layer of flexible conductive material to the second side of the sheet of flexible material.

8. A flexible circuit board manufactured by a method in accordance with claim 5.

9. A method of processing a sheet of insulating material having first and second opposite sides, at least one discrete contact pad on the first side, and a continuous layer of metal on the second side, comprising:

(a) removing metal from the second side so as to leave at least one discrete island that confronts the pad through the sheet of insulating material, and
 (b) applying force to the island in the direction from the second side toward the first side, whereby the island is deformed plastically to form a dimple and the pad is deformed plastically to form a bump.

10. A method in accordance with claim 9, wherein the flexible insulating material is polyimide, the metal of the first layer contains copper and the metal of the second layer contains copper.

11. A method in accordance with claim 9, further comprising:
 (c) applying a layer of flexible conductive material to the second side of the sheet of flexible material.

12. A flexible circuit board manufactured by a method in accordance with claim 9.

* * * * *